United States Patent
Wang

(10) Patent No.: US 8,315,041 B2
(45) Date of Patent: Nov. 20, 2012

(54) CONNECTING MECHANISM AND ELECTRONIC DEVICE UTILIZING THE SAME

(75) Inventor: Peng Wang, Shenzhen (CN)

(73) Assignees: Fu Tai Hua Industry (Shenzhen) Co., Ltd., ShenZhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 260 days.

(21) Appl. No.: 12/825,547

(22) Filed: Jun. 29, 2010

(65) Prior Publication Data

US 2011/0228453 A1 Sep. 22, 2011

(30) Foreign Application Priority Data

Mar. 19, 2010 (CN) .......................... 2010 1 0127910

(51) Int. Cl.
*H05K 5/00* (2006.01)
*H05K 7/00* (2006.01)

(52) U.S. Cl. ........... 361/679.01; 361/679.3; 361/679.55; 361/679.56; 361/679.57; 361/679.58

(58) Field of Classification Search ............. 361/679.01, 361/679.3, 679.55, 679.56, 679.57, 679.58
See application file for complete search history.

(56) References Cited

U.S. PATENT DOCUMENTS

| | | | | |
|---|---|---|---|---|
| 5,116,261 A * | 5/1992 | Lan et al. | ....................... | 312/292 |
| 6,735,990 B1 * | 5/2004 | Murray et al. | ..................... | 70/58 |
| 7,315,443 B2 * | 1/2008 | Allen | ....................... | 361/679.55 |
| 7,791,878 B2 * | 9/2010 | Ruan et al. | ............... | 361/679.58 |
| 2006/0133019 A1 * | 6/2006 | Yamazaki et al. | ............ | 361/683 |

* cited by examiner

*Primary Examiner* — Anthony Haughton
(74) *Attorney, Agent, or Firm* — Altis Law Group, Inc.

(57) ABSTRACT

A connecting mechanism for connecting a first housing and a second housing together is provided. The second housing defines a slot. The connecting mechanism includes a fixing member fixed on the first housing, two connecting elements, and a movable member. The two connecting elements are connected to the fixing member, and each connecting element comprises a main body, a pin protruding from the main body, and an enlarged head on the pin. The movable member comprises two sliding grooves. The heads are received in the two sliding grooves, and the main bodies are located outside the sliding grooves, respectively. To connect the first housing and the second housing together, the second housing is moved to cause the movable member to totally pass through the slot, the movable member is rotated from a vertical orientation to a substantially horizontal orientation and rests on the second housing.

17 Claims, 5 Drawing Sheets

CONNECTING MECHANISM AND ELECTRONIC DEVICE UTILIZING THE SAME

BACKGROUND

1. Technical Field

The present disclosure relates to connecting mechanisms and, particularly, to a connecting mechanism and an electronic device including a first housing and a second housing connected together by the connecting mechanism.

2. Description of Related Art

The use of a fastener mechanism to allow two separate articles to be operatively engaged is known. An auxiliary tool such as screwdriver is usually used to fasten/loosen a fastener mechanism. When there is no screwdriver at hand, a user may not be able to operate the fastener mechanism.

Therefore, what is needed is a new connecting mechanism which can overcome the described shortcoming.

DETAILED DESCRIPTION

Figure 1:
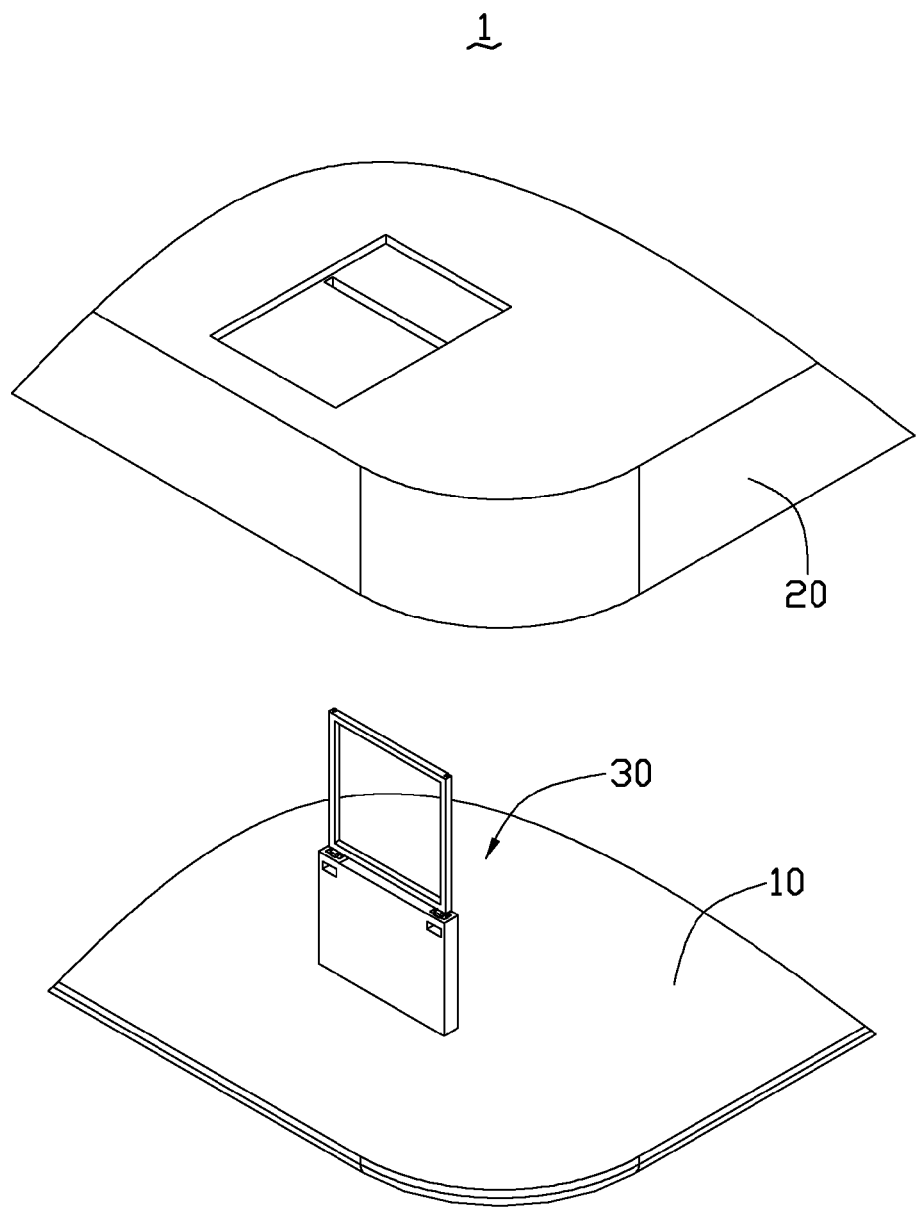
FIG. 1 is a partial, isometric view of an electronic device including a connecting mechanism in accordance with an exemplary embodiment.

Referring to FIG. 1, an exemplary embodiment of an electronic device 1 includes a first housing 10, a second housing 20, and a connecting mechanism 30 for connecting the first housing 10 and the second housing 20.

Figure 2:
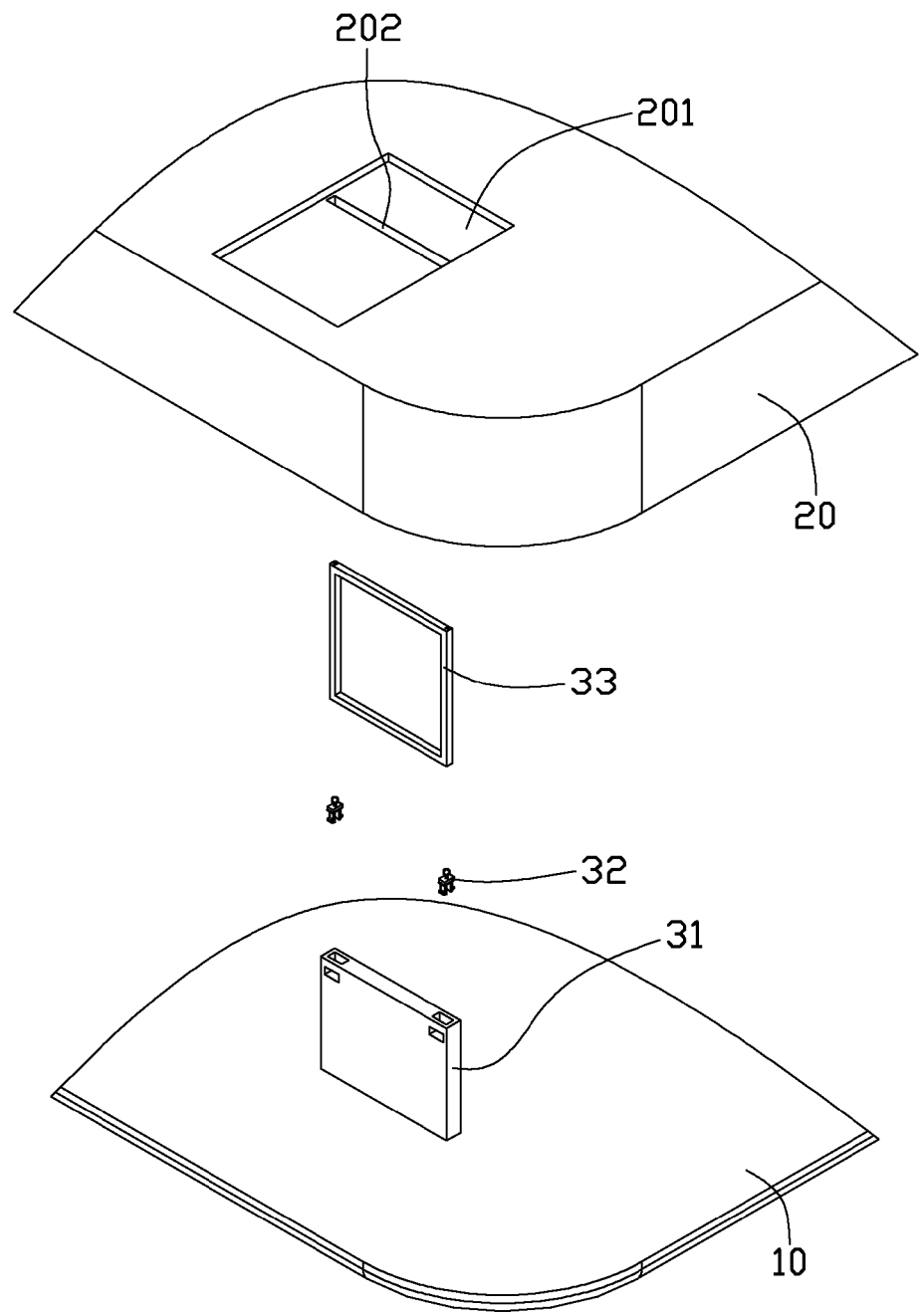
FIG. 2 is an exploded view of the electronic device of FIG. 1.

Referring to FIG. 2, the second housing 20 includes a recessed portion 201 defining a slot 202. The connecting mechanism 30 includes a fixing member 31 fixed on the first housing 10, two connecting elements 32, and a movable member 33.

Figure 3:
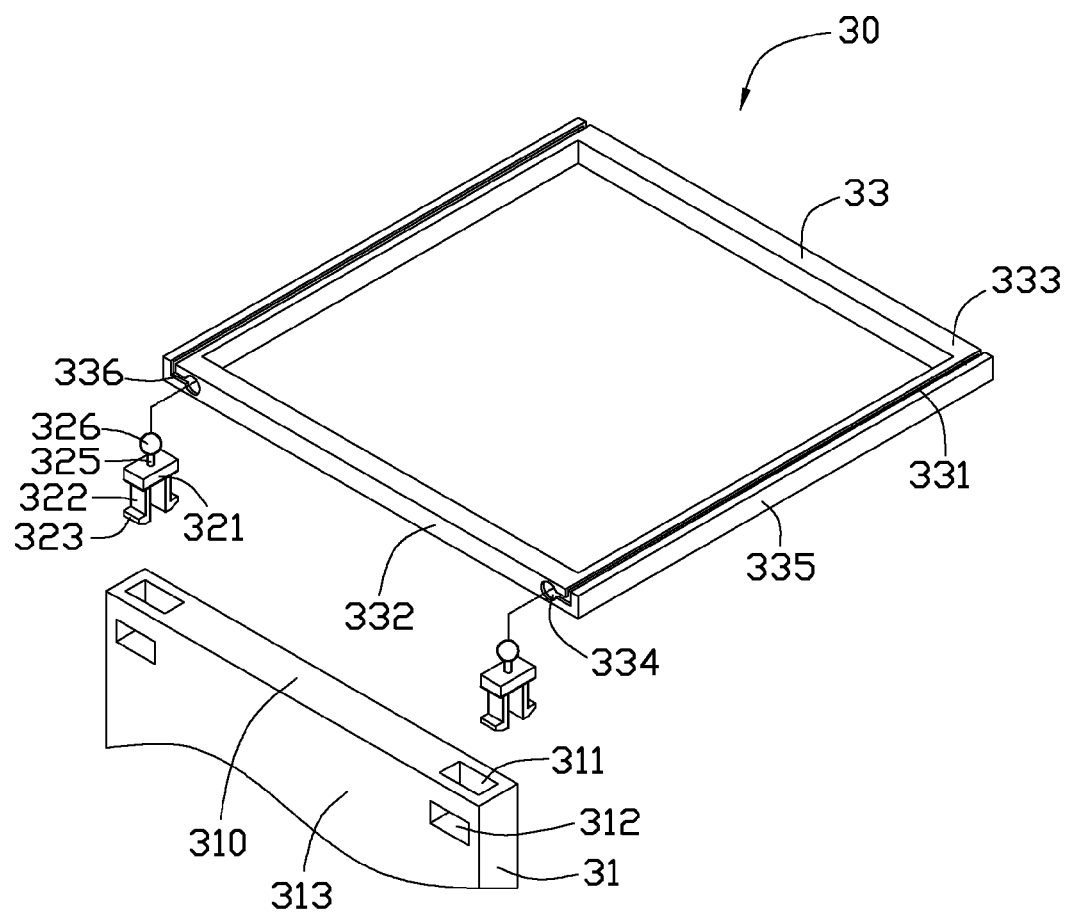
FIG. 3 is a partial view of the connecting mechanism.

Referring to FIG. 3, the fixing member 31 includes a top surface 310 defining two first openings 311 at its two ends, respectively. The fixing member 31 also defines two second openings 312 in a side surface 313 communicating with the first openings 311, respectively. In the embodiment, the second openings 312 are substantially trapeziform.

The connecting element 32 includes a main body 321, two elastic tabs 322 extending from the bottom surface of the main body 321. Each tab 322 includes a hook 323 at its end. A protruding pin 325 protrudes from the top surface of the main body 321 and includes an enlarged head 326. In the embodiment, the head 326 is substantially spherical. Each hook 323 is substantially trapeziform.

The movable member 33 is a rectangular frame, and includes a top bar 332, a bottom bar 333, and two side bars 335 each defining a sliding groove 331 extending along the entire length of the side bar 335. The top bar 332 defines two blind holes 334 adjacent to its ends. The top bar 332 further defines two passages 336 at its ends. Each passage 336 is communicated between the blind hole 334 and the sliding groove 331. Each blind hole 334 is substantially spherical, and has a diameter greater than that of the head 326, allowing the head 326 to insert into the blind hole 334.

The inner surface of each sliding groove 331 and passage 336 is substantially rectangular and larger than the diameter of the head 326, thereby allowing the head 326 sliding from the passage 336 to the sliding groove 331. The width of the sliding groove 331 and the passage 336 is less than the diameter of the head, thereby preventing the head 326 from sliding out of the sliding groove 331 and the passage 336.

When assembling the connecting mechanism 30, the elastic tabs 322 are inserted into the two first openings 311 with the hooks 323 engaging with the second openings 312 respectively, thereby snap connecting the connecting elements 32 to the fixing member 31. The two heads 326 are inserted into the blind holes 334, and then slid from the blind holes 334 to the passages 336 respectively, thereby connecting the connecting elements 32 to the movable member 33. After assembling, the connecting mechanism 30 is upright.

Figure 4:
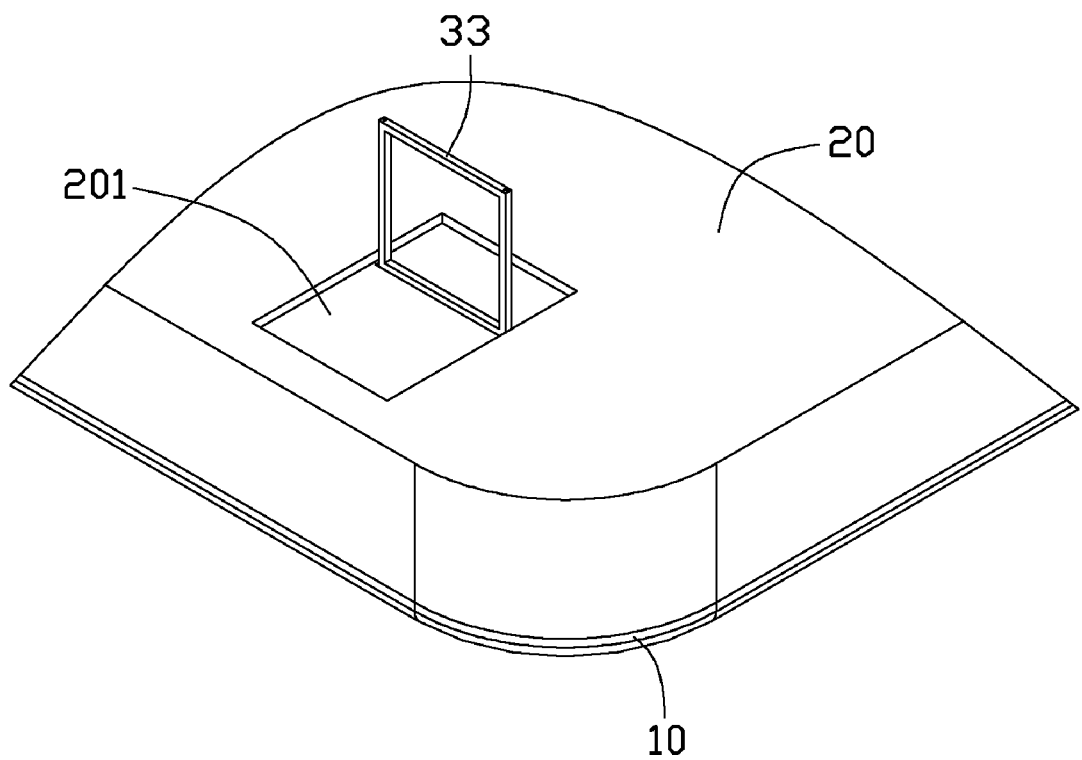
FIG. 4 is a schematic view of the connecting mechanism, in a first state.
Figure 5:
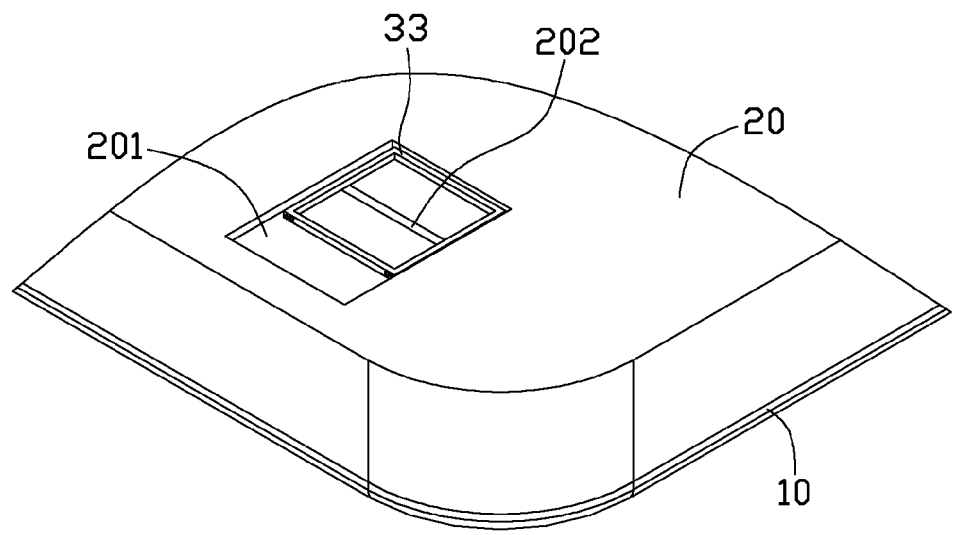
FIG. 5 is similar to FIG. 4, but showing the connecting mechanism in a second state.

Referring to FIGS. 4-5, after assembling the connecting mechanism 30, to connect the first housing 10 to the second housing 20, the second housing 20 is then moved to cause the bottom bar 332 of the moveable member 33 to pass through the slot 202 until the top bar 332 flushes with the bottom surface of the recessed portion 201. The movable member 33 is then rotated from a vertical orientation to a substantially horizontal orientation, thereby making the movable member 33 be totally received in the recessed portion 201. Because the width of the passage 336 is less than the diameter of the head 326, the movable member 33 cannot disengage from the head 326, thus connecting the second housing 20 to the first housing 10. In order to fix the connection between the first housing 10 and the second housing 20, the user can move the movable member 33 by sliding the pin 325 along the sliding groove 331 until the pin 325 slides in the middle of the sliding groove 331. Because the width of the sliding groove 331 is less than the diameter of the head 326, the head 326 cannot slide out of the sliding groove 331.

Although the present disclosure has been specifically described on the basis of the embodiments thereof, the disclosure is not to be construed as being limited thereto.

Various changes or modifications may be made to the embodiments without departing from the scope and spirit of the disclosure.

What is claimed is:

1. A connecting mechanism for connecting a first housing and a second housing together, the second housing defining a slot, the connecting mechanism comprising:

a fixing member for being fixed on the first housing, wherein the fixing member comprises a top surface defining two first openings at its two ends, and a side surface defining two second openings, each of the first openings is communicated with a corresponding second opening;

two connecting elements connected to the fixing member and each comprising a main body, a pin protruding from the main body, and an enlarged head on the pin, wherein each of the two connecting elements further comprises two elastic tabs extending from the bottom surface of the main body, each tab comprises a hook at its end, the tabs are inserted into the two first openings of the top surface with the hooks engaging with the two second openings of the side surface, thereby snap connecting the two connecting elements to the fixing member; and a movable member comprising two sliding grooves, wherein the heads are received in the two sliding grooves, and the main bodies are located outside of the sliding grooves, respectively;

wherein, to connect the first housing and the second housing together, the second housing is moved to cause the movable member to totally pass through the slot, the movable member is rotated from a vertical orientation to a substantially horizontal orientation and rests on the second housing.

2. The connecting mechanism as described in claim 1, wherein the second openings of the side surface and the hooks are trapeziform.

3. The connecting mechanism as described in claim 1, wherein the movable member is a rectangular frame.

4. The connecting mechanism as described in claim 3, wherein the movable member comprises a top bar, a bottom bar, and two side bars, each of the sliding grooves is defined in a respective one of the side bars and extends along the entire length of the side bar, the top bar defines two blind holes adjacent to its end and two passages at its ends, each of the passages is communicated between the blind hole and the sliding groove, the two heads are inserted into the blind holes, and then slid from the blind holes to the passages, respectively, thereby connecting the two connecting elements to the movable member.

5. The connecting mechanism as described in claim 4, wherein the head is substantially spherical.

6. The connecting mechanism as described in claim 5, wherein each of the blind holes is substantially spherical, and has a diameter greater than that of the head, allowing the head to insert into the blind hole.

7. The connecting mechanism as described in claim 4, wherein the inner surface of each of the sliding grooves and the passages is substantially and larger than the diameter of the head, thereby allowing the head to slide from the passage to the sliding groove.

8. The connecting mechanism as described in claim 4, wherein the width of each of the sliding groove and the passage is less than the diameter of the head, thereby preventing the head from sliding out of the sliding groove and the passage.

9. An electronic device comprising:
a first housing;
a second housing defining a slot; and
a connecting mechanism configured for connecting the first housing and the second housing together, and the connecting mechanism comprising:
a fixing member fixed on the first housing, wherein the fixing member comprises a top surface defining two first openings at its two ends, and a side surface defining two second openings, each of the first openings is communicated with a corresponding second opening;
two connecting elements connected to the fixing member and each comprising a main body, a pin protruding from the main body, and an enlarged head on the pin, wherein each of the two connecting elements further comprises two elastic tabs extending from the bottom surface of the main body, each tab comprises a hook at its end, the tabs are inserted into the two first openings of the top surface with the hooks engaging with the two second openings of the side surface, thereby snap connecting the two connecting elements to the fixing member; and
a movable member comprising two sliding grooves, wherein the heads are received in the two sliding grooves, and the main bodies are located outside of the sliding grooves, respectively;
wherein, to connect the first housing and the second housing together, the second housing is moved to cause the movable member to totally pass through the slot, the movable member is rotated from a vertical orientation to a substantially horizontal orientation and rests on the second housing.

10. The electronic device as described in claim 9, wherein the second openings of the side surface and the hooks are trapeziform.

11. The electronic device as described in claim 9, wherein the movable member is a rectangular frame.

12. The electronic device as described in claim 11, wherein the movable member comprises a top bar, a bottom bar, and two side bars, each of the sliding grooves is defined in a respective one of the side bars and extends along the entire length of the side bar, the top bar defines two blind holes adjacent to its end and two passages at its ends, each of the passages is communicated between the blind hole and the sliding groove, the two heads are inserted into the blind holes, and then slid from the blind holes to the passages, respectively, thereby connecting the two connecting elements to the movable member.

13. The electronic device as described in claim 12, wherein the head is substantially spherical.

14. The electronic device as described in claim 13, wherein each of the blind holes is substantially spherical, and has a diameter greater than that of the head, allowing the head to insert into the blind hole.

15. The electronic device as described in claim 12, wherein the inner surface of each of the sliding grooves and the passages is substantially rectangular and larger than the diameter of the head, thereby allowing the head to slide from the passage to the sliding groove.

16. The electronic device as described in claim 12, wherein the width of each of the sliding groove and the passage is less than the diameter of the head, thereby preventing the head from sliding out of the sliding groove and the passage.

17. A connecting mechanism, comprising:
a fixing member;
two connecting elements connected to the fixing member, and each connecting element comprising a main body, a pin protruding from the main body, and an enlarged head positioned on one end of the pin; and
a movable member comprising a top bar, a bottom bar, and two side bars, two sliding grooves being respectively defined in the two side bars and extending along the entire length of the side bar, the top bar defining two blind holes adjacent to its end and two passages, each of the passages being communicated between the blind hole and the sliding groove, and each of the two heads being inserted into the blind hole, and sliding from the blind hole to the sliding groove through the passage, and the main body is located the outside of the sliding groove.

* * * * *